(12) United States Patent
Mikkola et al.

(10) Patent No.: US 6,791,966 B1
(45) Date of Patent: Sep. 14, 2004

(54) SIGNAL CODING

(75) Inventors: Hannu Mikkola, Tampere (FI); Janne Vainio, Lempäälä (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/255,894

(22) Filed: Feb. 23, 1999

(30) Foreign Application Priority Data

Feb. 25, 1998 (FI) .................................................. 980431

(51) Int. Cl.$^7$ .............................................. H04Q 7/28
(52) U.S. Cl. ..................................... 370/343; 370/441
(58) Field of Search .............................. 370/208, 209, 370/328, 329, 335, 342, 441, 468, 343

(56) References Cited

U.S. PATENT DOCUMENTS

| 4,901,319 A | 2/1990 | Ross .............................. 371/45 |
| 5,646,935 A | 7/1997 | Ishikawa et al. ............. 370/207 |
| 5,666,370 A | 9/1997 | Ganesan et al. .......... 371/37.01 |
| 5,923,679 A | 7/1999 | Itoh et al. ................. 371/37.01 |
| 5,949,796 A * | 9/1999 | Kumar ........................ 370/487 |
| 6,202,188 B1 * | 3/2001 | Suzuki et al. ............... 714/758 |

FOREIGN PATENT DOCUMENTS

| EP | 0659002 A1 | 6/1995 |
| EP | 0820152 A1 | 1/1998 |
| JP | 06-204983 | 7/1994 |
| JP | 06-252891 | 9/1994 |
| JP | 07-254915 | 10/1995 |
| JP | 07-273741 | 10/1995 |
| JP | 08-265294 | 10/1996 |
| JP | 09-116440 | 5/1997 |
| WO | WO 96/23360 | 8/1996 |
| WO | WO 97/37434 | 10/1997 |

OTHER PUBLICATIONS

"Digital Cellular Telecommunications System (Phase 2+); Channel Coding" (GSM 05.03 version 5.4.0), European Telecommunications Standard, Nov. 1997.
The GSM System for Mobile Communications, Mouly and Pautet, 1992, ISBN: 2–9507190–0–7, Section 4.3.1.1., pps 233–255.
Finnish Office Action.

* cited by examiner

Primary Examiner—Vivian Chin
Assistant Examiner—Lewis G. West
(74) Attorney, Agent, or Firm—Perman & Green, LLP

(57) ABSTRACT

A method of transmitting a codeword over a transmission channel using a plurality of radio bursts. The codeword comprises a first sequence of time ordered protected bits and a second sequence of time ordered unprotected bits, and the radio bursts together provide a set of time ordered bit positions. Successive bits of said first sequence are allocated to the radio bursts in a cyclical manner so that adjacent protected bits are allocated to different radio bursts, while successive bits of said second sequence are allocated to remaining bit positions of the radio bursts in the time order of those remaining bit positions. The radio bursts are then transmitted sequentially on different frequency bands.

11 Claims, 3 Drawing Sheets

|   | 0 | 1 | 2 | 3 | 4 | 5 | 6 | 7 | 8 | 9 |
|---|---|---|---|---|---|---|---|---|---|---|
| Burst 1 | $A_0$ | $A_4$ | $A_8$ | $A_{12}$ | $A_{16}$ | $A_{20}$ | $A_{24}$ | $Z_0$ | $Z_1$ | $Z_2$ |
| Burst 2 | $A_1$ | $A_5$ | $A_9$ | $A_{13}$ | $A_{17}$ | $A_{21}$ | $X_0$ | $X_1$ | $X_2$ | $X_3$ |
| Burst 3 | $A_2$ | $A_6$ | $A_{100}$ | $A_{14}$ | $A_{18}$ | $A_{22}$ | $X_4$ | $Y_0$ | $Y_1$ | $Y_2$ |
| Burst 4 | $A_3$ | $A_7$ | $A_{11}$ | $A_{15}$ | $A_{19}$ | $A_{23}$ | $Y_3$ | $Y_4$ | $Y_5$ | $Y_5$ |

|  | 0 | 4 | 8 | 12 | ··· | 452 |
|---|---|---|---|---|---|---|
| Burst 1 | | | | | | |
| Burst 2 | 1 | | | | | |
| Burst 3 | 2 | | | | | |
| Burst 4 | 3 | 7 | ··· | | | 455 |

Figure 1    PRIOR ART

|  | 0 | 1 | 2 | 3 | 4 | 5 | 6 | 7 | 8 | 9 |
|---|---|---|---|---|---|---|---|---|---|---|
| Burst 1 | $A_0$ | $A_4$ | $A_8$ | $A_{12}$ | $A_{16}$ | $A_{20}$ | $A_{24}$ | $X_3$ | $Y_2$ | $Y_6$ |
| Burst 2 | $A_1$ | $A_5$ | $A_9$ | $A_{13}$ | $A_{17}$ | $A_{21}$ | $X_0$ | $X_4$ | $Y_3$ | $Z_0$ |
| Burst 3 | $A_2$ | $A_6$ | $A_{10}$ | $A_{14}$ | $A_{18}$ | $A_{22}$ | $X_1$ | $Y_0$ | $Y_4$ | $Z_1$ |
| Burst 4 | $A_3$ | $A_7$ | $A_{11}$ | $A_{15}$ | $A_{19}$ | $A_{23}$ | $X_2$ | $Y_1$ | $Y_5$ | $Z_2$ |

Figure 2    PRIOR ART

|  | 0 | 1 | 2 | 3 | 4 | 5 | 6 | 7 | 8 | 9 |
|---|---|---|---|---|---|---|---|---|---|---|
| Burst 1 | $A_0$ | $A_4$ | $A_8$ | $A_{12}$ | $A_{16}$ | $A_{20}$ | $A_{24}$ | $Z_0$ | $Z_1$ | $Z_2$ |
| Burst 2 | $A_1$ | $A_5$ | $A_9$ | $A_{13}$ | $A_{17}$ | $A_{21}$ | $X_0$ | $X_1$ | $X_2$ | $X_3$ |
| Burst 3 | $A_2$ | $A_6$ | $A_{100}$ | $A_{14}$ | $A_{18}$ | $A_{22}$ | $X_4$ | $Y_0$ | $Y_1$ | $Y_2$ |
| Burst 4 | $A_3$ | $A_7$ | $A_{11}$ | $A_{15}$ | $A_{19}$ | $A_{23}$ | $Y_3$ | $Y_4$ | $Y_5$ | $Y_5$ |

SIGNAL CODING

FIELD OF THE INVENTION

The present invention relates to signal coding and in particular, though not necessarily, to the digital coding of speech signals.

BACKGROUND OF THE INVENTION

In modern cellular radio telephone systems, sampled and digitised speech signals are coded prior to transmission over the air interface to reduce the channel bandwidth occupied by the transmitted signal. Considering for example the Global System for Mobile Communications (GSM) Phase 1 defined by the European Telecommunications Standards Institute (ETSI), speech signals are divided into time frames of 20 ms and each frame is coded using a Regular Pulse Excitation—Long Term Prediction (RPE-LTP) algorithm to remove long and short term redundancy from the signal. The result of this coding process is a set of 260 bits for each 20 ms frame.

It is also desirable to allow a receiver to identify and possibly correct errors introduced into the coded signal during transmission. This can be done for example by error correction coding. However, error correction coding introduces redundant information into the transmitted signal thereby increasing the signal bandwidth. To avoid increasing signal bandwidth by too great an extent, the GSM Phase 1 system provides error correction coding for only the 182 subjectively most important bits of a coded frame, leaving the remaining 78 bits unprotected. In particular, GSM uses a 3-bit cyclic redundancy check (CRC) for the 50 most important bits in addition to ½-rate convolution coding for the 182 most significant bits (including the 50 bits protected by CRC). CRC and convolution coding increases the number of bits per frame from 260 to 456 (the 456 bit unit is often referred to as a "channel encoded frame" or merely as a "codeword").

In GSM, a codeword is transmitted by way of a series of radio bursts, with "frequency hopping" being used to shift the carrier frequency of a burst relative to that of the preceding burst and of the succeeding burst. This use of frequency hopping tends to reduce the effect of so-called "burst errors" which disrupt data on a given carrier frequency. The effect of a burst error can also be spread more evenly across a codeword by interleaving the bits of the codeword in the radio bursts. This tends to increase the ability of the convolution coding to correct burst errors. The general concept of interleaving is illustrated in FIG. 1, where the 456 bits of a codeword are interleaved on four successive radio bursts, each burst containing 114 information bits (a burst typically contains other data bits but these are omitted from FIG. 1 in the interest of clarity).

GSM interleaves the bits of a codeword regardless of whether or not the bits are protected or unprotected. Consider for example the simplified case of a 40 bit codeword consisting of a stream of 25 protected bits $A_0$ to $A_{24}$ followed by a stream of 15 unprotected bits. The unprotected bits consist of three multi-bit coding parameters; $X_0$ to $X_4$, $Y_0$ to $Y_6$, and $Z_0$ to $Z_2$. The 40 bits are interleaved into four 10 bit radio bursts as illustrated in FIG. 2. As already discussed, successive bursts are transmitted on different carrier frequencies.

Consider the case where one of the radio bursts of FIG. 2 is totally corrupted by a burst error, leaving the other three bursts error free. Regardless of which burst is corrupted, one of the X and the Y parameters will be corrupted (1.0 error probability) whilst there is a 0.75 probability that the Z parameter will be corrupted. In GSM Phase 2 (which uses the Enhanced Full Rate speech codec: GSM 06.60), the parameters X, Y, and Z typically define the positions of respective pulses in an excitation vector. As such, all of the information conveyed by a parameter is lost if even only one parameter bit is erroneous. There is thus a high probability that a single burst error will result in the effective loss of the excitation vector.

As has been stated, FIG. 2 illustrates only a simplified example of interleaving. A more detailed description of the channel coding and interleaving processes used in GSM is given in "The GSM System for Mobile Communications" by Mouly and Pautet, 1992, ISBN: 2-9507190-0-7. ETSI recommendation GSM 05.03 November 1997 provides details of channel coding and interleaving processes proposed for GSM Phase 2+. It is noted in particular that in this GSM recommendation (Chapter 3.1.3; Table 1) codeword bits are inserted diagonally into the burst structure, rather than in the vertical columns illustrated in FIGS. 1 and 2.

SUMMARY OF THE INVENTION

It is an object of the present invention to overcome or at least mitigate the disadvantage of conventional interleaving processes noted in the preceding paragraph. In particular, it is an object of the present invention to provide for the interleaving of codeword bits in such way that unprotected multi-bit parameters are made more robust against burst errors.

These and other objects are achieved by interleaving unprotected bits in a parameter-wise fashion, rather than in a bit-wise fashion.

According to a first aspect of the present invention there is provided a method of transmitting a codeword over a transmission channel using a plurality of radio bursts, the codeword comprising a first ordered sequence of protected bits and a second ordered sequence of unprotected bits, and the radio bursts together providing a set of chronologically ordered bit positions, the method comprising:

defining first and second sets of bit positions in the radio bursts;

allocating successive bits of said first sequence to said first set of bit positions in a cyclical manner with respect to the radio bursts so that adjacent protected bits are allocated to different radio bursts;

allocating successive bits of said second sequence to said second set of bit positions in the chronological order of those bit positions; and transmitting the radio bursts comprising the allocated bits.

Embodiments of the present invention provide for the interleaving of protected bits of a codeword amongst radio bursts so that the coding process by which these bits are protected may be robust against transmission errors, such as burst errors. These embodiments also achieve the approximate grouping of parameter bits, making up the unprotected parameters, into a single or limited number of radio bursts, thus minimising the number of parameter which will be affected by a single burst error.

The codeword may comprise additional unprotected bits which are allocated to the radio bursts together with the protected bits of said first sequence in said cyclical manner. This may be appropriate for example where a coding parameter consists of a number of codeword bits, only one of which is unprotected such that there is no benefit to be achieved by including that unprotected bit in said second sequence.

Preferably, said plurality of radio bursts are transmitted sequentially and on different frequency bands. A radio burst may additionally contain data bits other than those allocated from the codeword.

Preferably, the codeword comprises coded data corresponding to a time frame of an audio signal. More preferably, the audio signal is a speech signal. The method of the present invention is particularly applicable to cellular radio telephone systems where the transmission channel is the air interface between a mobile communications device and a base transceiver station of the cellular system.

Preferably said second ordered sequence comprises a plurality of multi-bit coding parameters and the bits of a given parameter occupy neighbouring positions in the sequence.

Preferably, said first ordered sequence of bits is protected by convolution coding. The first sequence may additionally be protected by a cyclic redundancy check code.

Embodiments of the present invention may be arranged to transmit at least two codewords using said plurality of radio bursts, the method comprising interleaving the bits of the codewords in the bit positions of the radio bursts. For example, for a first codeword, said first and second sets of bit positions may be provided by even numbered bit positions of the radio bursts, whilst for a second codeword said first and second sets of bit positions may be provided by odd numbered bit positions. The radio bursts may comprise additional data bits such as those making up a training or synchronisation sequence for use by the receiver.

According to a second aspect of the present invention there is provided apparatus for transmitting a codeword over a transmission channel using a plurality of radio bursts, the codeword comprising a first ordered sequence of protected bits and a second ordered sequence of unprotected bits, and the radio bursts together providing a set of chronologically ordered bit positions, the apparatus comprising:
    an input for receiving the codeword;
    a memory for defining first and second sets of bit positions in the radio bursts;
    signal processing means for allocating successive bits of said first sequence to said first set of bit positions in a cyclical manner with respect to the radio bursts so that adjacent protected bits are allocated to different radio bursts, and for allocating successive bits of said second sequence to said second set of bit positions in the chronological order of those bit positions; and
    a transmitter for transmitting the radio bursts comprising the allocated bits.

Preferably, the apparatus of the present invention comprises a speech encoder for encoding time frames of an audio signal into respective codewords, and for providing the codewords to said input.

According to a third aspect of the present invention there is provided a mobile communications device comprising apparatus according to the above second aspect of the invention.

According to a fifth aspect of the present invention there is provided a base station controller of a cellular radio telephone network, the base station controller comprising apparatus according to the above second aspect of the present invention.

BRIEF DESCRIPTION OF THE DRAWINGS

For a better understanding of the present invention and in order to show how the same may be carried into effect reference will now be made, by way of example, to the accompanying drawings, in which:

FIG. 1 illustrates a bit interleaving process for a cellular radio telephone system;

FIG. 2 illustrates a bit interleaving process for a simplified example showing the allocation of protected and unprotected bits of a codeword;

DETAILED DESCRIPTION

Figures 3, 4:
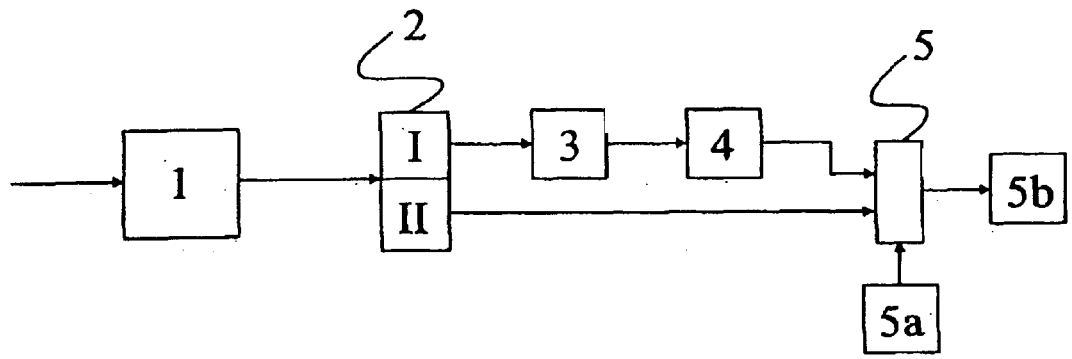
FIG. 3 illustrates schematically a speech coding system.
FIG. 4 illustrates a modified bit allocation process for the simplified example of FIG. 2.

FIGS. 1 and 2 illustrate the conventional bit interleaving process used in cellular radio telephone codecs, and have been described above. FIG. 3 illustrates schematically a speech codec such as might be used to implement this process. A sampled and digitised speech signal is provided to the input of a speech encoder 1. In the current GSM Phase 1 system, this encoder implements a Regular Pulse Excitation—Long Term Prediction (RPE-LTP) algorithm which generates at the output of the encoder 1 a set of 260 bits for each 20 ms frame of the speech signal.

The exact nature of these 260 bits will not be described in detail here. It is sufficient to say that the corresponding frame of the speech signal can be approximately reconstructed using these bits (for details the reader should refer to the GSM standards and recommendations). However, it is relevant here that certain multi-bit coding parameters are defined by respective sub-sets of the 260 bits. It is also relevant that the 260 bits are ranked in order of importance according to predetermined subjective listening tests. Thus, bits which have little effect on the reconstructed frame are given a high index, whilst bits which have a significant effect on the reconstructed frame are given a low index. A classifier 2 selects from the output of the encoder 1 the subjectively most important 182 bits (Class I) and provides these to a cyclic redundancy check (CRC) unit 3. This unit 3 generates a 3-bit CRC code from the subjectively most important 50 bits. The Class I bits, together with the 3-bit CRC code, are then provided to a convolution encoder 4 which generates two bits for each of the Class I bits, for each of the 4 convolution encoding tail bits, and for each of the 3 CRC bits. For each frame of the speech signal, the output of the convolution encoder 4 therefore consists of 378 bits. These bits are then combined at a multiplexer 5 with the remaining 78 subjectively least important bits (Class II) output by the classifier 2 to provide a 456 bit codeword for each 20 ms frame of the input speech signal. The codeword is provided to a radio frequency transmitter 5$b$.

The multiplexer 5 is arranged to interleave the bits of each codeword into four radio bursts. The conventional interleaving pattern is as shown in FIG. 1 (and as exemplified by FIG. 2). However, this conventional pattern tends to spread the unprotected bits of coding parameters over several radio bursts, increasing the probability that a parameter will be affected by a burst error. As has already been explained, it is often the case that the loss of even a single bit of a parameter is sufficient to render the parameter useless.

An interleaving pattern such as is illustrated in FIG. 4 is therefore used instead. As with FIG. 2, FIG. 4 uses the simplified example of 25 protected bits $A_0$ to $A_{24}$ and 15 unprotected bits consisting of three coding parameters; $X_0$ to $X_4$, $Y_0$ to $Y_6$, and $Z_0$ to $Z_2$. The 25 protected bits are allocated cyclically to the four 10 bit radio bursts in the conventional way. However, when this allocation is complete, the unprotected bits are allocated parameter-wise in the chronological order of the remaining bit positions of the radio bursts. That is to say that the bits of the first parameter Z are allocated in turn to bit positions 7, 8, and 9 of radio burst 1, then the bits of the parameter X are allocated in turn to bit positions 6 to 9 of burst 2, and bit position 6 of burst 3, and finally the bits of the parameter Y are allocated in turn to bit positions 8 and 9 of burst 3 and bit positions 6 to 9 of burst 4. The mapping of protected and unprotected bits to the radio burst positions is carried out by the multiplexer 5 under the control of a processor/memory 5a which defines two respective sets of radio burst bit positions.

This allocation process concentrates the bits of a given parameter in one or at most two radio bursts. Considering the situation where a single burst error destroys one of the four radio busts, the probability that an error will arise in the parameter Z is 0.25, the probability that an error will arise in the X parameter is 0.5, and the probability that an error will arise in the Y parameter is also 0.5. This represents a significant improvement over the error probability resulting from the bit allocation of FIG. 2.

Figure 5:
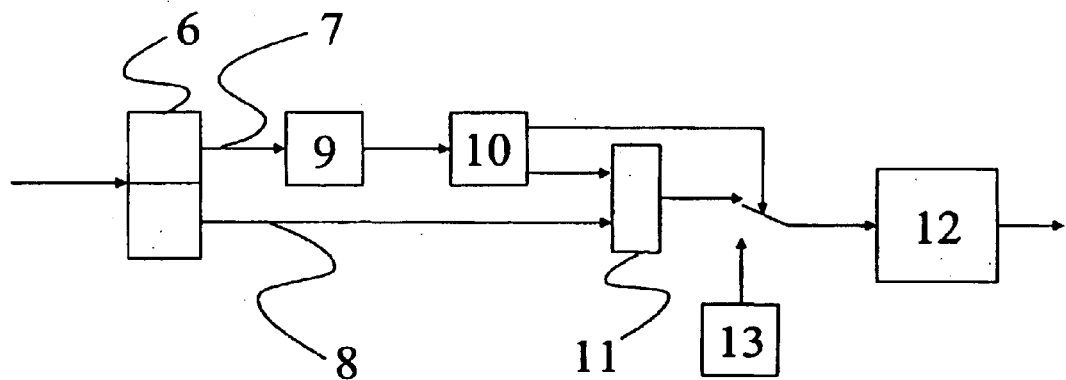
FIG. 5 illustrates schematically a speech decoding system.

Returning to the more complex 456 bit codeword example, FIG. 5 illustrates schematically a decoder suitable for decoding a signal encoded with the coder of FIG. 3 and using the bit allocation process exemplified in FIG. 4. The four radio bursts containing the interleaved codeword bits are received by a demultiplexer 6. The demultiplexer 6 rearranges the interleaved sequence into a first sequence 7 containing the protected Class I bits and a second sequence 8 containing the unprotected Class II bits. The sequence of Class I bits are provided to a convolution decoder 9 and then to a CRC unit 10 which checks for errors in the 50 most important bits using the 3 CRC bits. A multiplexer 11 is then used to combine the (error corrected) Class I bits and the Class II bits to generate for each frame the 260 bit coded frame which is decoded with a speech decoder 12. In the event that the CRC unit 10 detects an error in the 50 most important bits of the received codeword, the unit 10 causes the received frame data to be rejected. A substitute frame, generated by frame replacement unit 13, may be introduced based for example on one or more previous frames.

Figure 6:
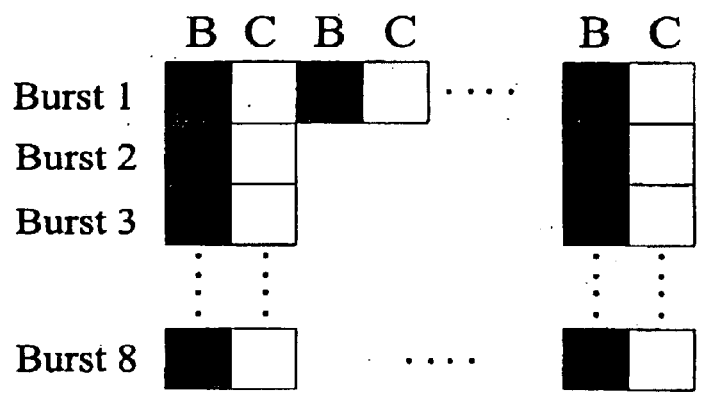
FIG. 6 illustrates the interleaving of bits of two codewords corresponding to two successive frames of a coded speech signal.

In GSM, the interleaving process is more complex than the simplified examples given above. In particular, rather than transmitting a single codeword on four successive radio bursts, two successive codewords are sent simultaneously, interleaved on eight successive radio bursts. For example, one codeword may be allocated the odd bits of the eight radio bursts, with the other codeword being allocated the even bits. This is illustrated in FIG. 6 for two codewords B and C. Of the odd bit positions, a first set of positions is defined for carrying the protected bits of codeword B and a second set is defined for carrying the unprotected bits of codeword B. The protected bits are then allocated bit-wise and diagonally across the burst structure (see GSM 05.03; Chapter 3.1.3; Table 1) and the unprotected bits are allocated parameter-wise as described above. A similar process is carried for codeword C and the even bit positions of the radio bursts.

Table 1 below lists in column 1 the unprotected (Class II) bits for the GSM Phase 1 full rate codec. Column 2 of Table 1 shows the conventional burst mapping (0 to 7) of these bits as defined in GSM standard 05.03. Column 3 shows the modified burst mapping according to the parameter-wise bit allocation process described above, where changes to the 05.03 mapping are shown underlined. The parameter bits highlighted in grey are bits which belong to parameters having two or more unprotected bits and for which the parameter-wise allocation can achieve an improvement in burst error performance.

It will be appreciated by the skilled person that various modifications may be made to the above described embodiments without departing from the scope of the present invention. In particular, the present invention may be advantageously applied to revisions of the current GSM Phase 1 standard. For example, GSM Phase 2+ uses the Enhanced Full Rate (EFR) speech codec (GSM 06.60) in which a codeword (of variable length) for a speech frame contains an algebraically defined excitation vector. In this case, the unprotected bits (allocated parameter-wise) will tend to consist of bits defining the positions of pulses in the excitation vector. The parameter-wise allocation of unprotected codeword bits in a series of radio bursts may also be applied in radio telephone systems other than the GSM system, including third generation systems such as UMTS.

TABLE 1

| Bit ID | Burst allocation in GSM 05.03 | Modified GSM burst allocation |
|---|---|---|
| LAR 1 bit 0 | 3 | 3 |
| LAR 2 bit 1 | 4 | 4 |
| LAR 2 bit 0 | 6 | 4 |
| LAR 3 bit 1 | 5 | 2 |
| LAR 3 bit 0 | 2 | 2 |
| LAR 4 bit 1 | 3 | 3 |
| LAR 4 bit 0 | 4 | 3 |
| LAR 5 bit 0 | 5 | 5 |
| LAR 6 bit 1 | 6 | 6 |
| LAR 6 bit 0 | 7 | 6 |
| LAR 7 bit 0 | 7 | 7 |
| LAR 8 bit 1 | 0 | 0 |
| LAR 8 bit 0 | 1 | 0 |
| XMAX 1 bit 0 | 6 | 6 |
| XMAX 2 bit 0 | 7 | 7 |
| XMAX 3 bit 0 | 0 | 1 |
| XMAX 4 bit 0 | 1 | 1 |
| subframe 1 pulse 1 bit 0 | 2 | 5 |
| subframe 1 pulse 2 bit 0 | 3 | 4 |
| subframe 1 pulse 3 bit 0 | 4 | 4 |
| subframe 1 pulse 4 bit 0 | 5 | 5 |
| subframe 1 pulse 5 bit 0 | 6 | 6 |
| subframe 1 pulse 6 bit 0 | 7 | 7 |
| subframe 1 pulse 7 bit 0 | 0 | 0 |
| subframe 1 pulse 8 bit 0 | 1 | 1 |
| subframe 1 pulse 9 bit 0 | 2 | 2 |
| subframe 1 pulse 10 bit 0 | 3 | 3 |
| subframe 1 pulse 11 bit 0 | 4 | 4 |
| subframe 1 pulse 12 bit 0 | 5 | 5 |
| subframe 1 pulse 13 bit 0 | 6 | 6 |
| subframe 2 pulse 1 bit 0 | 7 | 7 |
| subframe 2 pulse 2 bit 0 | 0 | 0 |
| subframe 2 pulse 3 bit 0 | 1 | 1 |
| subframe 2 pulse 4 bit 0 | 2 | 2 |
| subframe 2 pulse 5 bit 0 | 3 | 3 |
| subframe 2 pulse 6 bit 0 | 4 | 4 |
| subframe 2 pulse 7 bit 0 | 5 | 5 |
| subframe 2 pulse 8 bit 0 | 6 | 6 |
| subframe 2 pulse 9 bit 0 | 7 | 7 |
| subframe 2 pulse 10 bit 0 | 0 | 0 |
| subframe 2 pulse 11 bit 0 | 1 | 1 |
| subframe 2 pulse 12 bit 0 | 2 | 2 |
| subframe 2 pulse 13 bit 0 | 3 | 3 |
| subframe 3 pulse 1 bit 0 | 4 | 4 |
| subframe 3 pulse 2 bit 0 | 5 | 5 |
| subframe 3 pulse 3 bit 0 | 6 | 6 |
| subframe 3 pulse 4 bit 0 | 7 | 7 |
| subframe 3 pulse 5 bit 0 | 0 | 0 |
| subframe 3 pulse 6 bit 0 | 1 | 1 |

TABLE 1-continued

| Bit ID | Burst allocation in GSM 05.03 | Modified GSM burst allocation |
| --- | --- | --- |
| subframe 3 pulse 7 bit 0 | 2 | 2 |
| subframe 3 pulse 8 bit 0 | 3 | 3 |
| subframe 3 pulse 9 bit 0 | 4 | 4 |
| subframe 3 pulse 10 bit 0 | 5 | 5 |
| subframe 3 pulse 11 bit 0 | 6 | 6 |
| subframe 3 pulse 12 bit 0 | 7 | 7 |
| subframe 3 pulse 13 bit 0 | 0 | 0 |
| subframe 4 pulse 1 bit 0 | 1 | 1 |
| subframe 4 pulse 2 bit 0 | 2 | 3 |
| subframe 4 pulse 3 bit 0 | 3 | 5 |
| subframe 4 pulse 4 bit 0 | 4 | 7 |
| subframe 4 pulse 5 bit 1 | 2 | 2 |
| subframe 4 pulse 5 bit 0 | 5 | 2 |
| subframe 4 pulse 6 bit 1 | 3 | 3 |
| subframe 4 pulse 6 bit 0 | 6 | 3 |
| subframe 4 pulse 7 bit 1 | 4 | 4 |
| subframe 4 pulse 7 bit 0 | 7 | 4 |
| subframe 4 pulse 8 bit 1 | 5 | 5 |
| subframe 4 pulse 8 bit 0 | 0 | 5 |
| subframe 4 pulse 9 bit 1 | 6 | 6 |
| subframe 4 pulse 9 bit 0 | 1 | 6 |
| subframe 4 pulse 10 bit 1 | 7 | 7 |
| subframe 4 pulse 10 bit 0 | 2 | 7 |
| subframe 4 pulse 11 bit 1 | 0 | 0 |
| subframe 4 pulse 11 bit 0 | 3 | 0 |
| subframe 4 pulse 12 bit 1 | 1 | 1 |
| subframe 4 pulse 12 bit 0 | 4 | 1 |
| subframe 4 pulse 13 bit 1 | 2 | 2 |
| subframe 4 pulse 13 bit 0 | 5 | 2 |

What is claimed is:

1. A method of transmitting a codeword over a transmission channel using a plurality of radio bursts, the codeword comprising a first ordered sequence of protected bits and a second ordered sequence of unprotected bits, and the radio bursts together providing a set of chronologically ordered bit positions, the method comprising:

defining first and second sets of bit positions in the radio bursts;

allocating successive bits of said first sequence to said first set of bit positions in a cyclical manner with respect to the radio bursts so that adjacent protected bits are allocated to different radio bursts;

allocating successive bits of said second sequence to said second set of bit positions in the chronological order of those bit positions; and transmitting the radio bursts comprising the allocated bits.

2. A method according to claim 1, wherein said plurality of radio bursts are transmitted sequentially and on different frequency bands.

3. A method according to claim 1, wherein the codeword comprises coded data corresponding to a time frame of an audio signal.

4. A method according to claim 3, wherein said second ordered sequence comprises a plurality of multi-bit coding parameters and the bits of a given parameter occupy neighbouring positions in the sequence so that those bits tend to be allocated to the same radio burst.

5. A method according to claim 3, wherein said first ordered sequence of bits is protected by convolution coding.

6. A method according to claim 1 and comprising transmitting at least two codewords using said plurality of radio bursts, the method comprising interleaving the bits of the codewords in the bit positions of the radio bursts.

7. A method according to claim 6, wherein for a first codeword said first and second sets of bit positions are provided by even numbered bit positions of the radio bursts, and for a second codeword said first and second sets of bit positions are provided by odd numbered bit positions.

8. Apparatus for transmitting a codeword over a transmission channel using a plurality of radio bursts, the codeword comprising a first ordered sequence of protected bits and a second ordered sequence of unprotected bits, and the radio bursts together providing a set of chronologically ordered bit positions, the apparatus comprising:

an input for receiving the codeword;

a memory for defining first and second sets of bit positions in the radio bursts;

signal processing means for allocating successive bits of said first sequence to said first set of bit positions in a cyclical manner with respect to the radio bursts so that adjacent protected bits are allocated to different radio bursts, and for allocating successive bits of said second sequence to said second set of bit positions in the chronological order of those bit positions; and a transmitter for transmitting the radio bursts comprising the allocated bits.

9. Apparatus according to claim 8 and comprising a speech encoder for encoding time frames of an audio signal into respective codewords, and for providing the codewords to said input.

10. A mobile communications device comprising apparatus according to claim 8.

11. A base station controller of a cellular radio telephone network, the base station controller comprising apparatus according to claim 8.

* * * * *